(12) United States Patent
Ryat (10) Patent No.: US 8,570,095 B1
(45) Date of Patent: Oct. 29, 2013

(54) OFFSET-COMPENSATED ACTIVE LOAD AND METHOD

(75) Inventor: Marc Henri Ryat, St Clar de Riviere (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/469,416

(22) Filed: May 11, 2012

(51) Int. Cl.
*G05F 1/10* (2006.01)

(52) U.S. Cl.
USPC .......................................... 327/530; 327/538

(58) Field of Classification Search
None
See application file for complete search history.

(56) References Cited

U.S. PATENT DOCUMENTS

| | | | | |
|---|---|---|---|---|
| 4,858,195 | A | * | 8/1989 | Soneda ........................ 365/205 |
| 5,017,805 | A | * | 5/1991 | Kase ............................. 327/88 |
| 5,565,813 | A | * | 10/1996 | Connell et al. ................ 330/9 |
| 6,448,836 | B2 | | 9/2002 | Kokubun et al. |
| 6,531,907 | B2 | * | 3/2003 | Dooley et al. ................ 327/307 |
| 6,577,184 | B2 | * | 6/2003 | Kwan et al. ..................... 330/9 |
| 6,697,001 | B1 | * | 2/2004 | Oliaei et al. ................... 341/143 |
| 6,750,704 | B1 | * | 6/2004 | Connell et al. .................. 330/9 |
| 6,806,769 | B2 | | 10/2004 | Imayama et al. |
| 7,042,384 | B2 | * | 5/2006 | Shimizu et al. ............... 341/156 |
| 7,443,234 | B2 | | 10/2008 | Iriguchi |
| 7,508,259 | B2 | | 3/2009 | Tsuchi |
| 7,564,271 | B2 | * | 7/2009 | Shionoiri et al. ............... 327/51 |
| 7,623,054 | B2 | | 11/2009 | Iriguchi et al. |
| 7,626,428 | B2 | * | 12/2009 | Matsuki ....................... 327/108 |
| 7,795,961 | B2 | * | 9/2010 | Kojima et al. .................... 330/9 |
| 7,920,009 | B2 | | 4/2011 | Kosic et al. |
| 8,169,255 | B2 | * | 5/2012 | Chang et al. .................. 327/538 |
| 8,248,108 | B2 | * | 8/2012 | Santoro et al. ................. 327/63 |
| 2003/0214351 | A1 | | 11/2003 | Nandy et al. |

OTHER PUBLICATIONS

Richard Palmer, DC Parameters: Input Offset Voltage (VIO), Application Report SLOA059 from Texas Instruments, 2001, pp. 1-24.

\* cited by examiner

*Primary Examiner* — Thomas J Hiltunen
(74) *Attorney, Agent, or Firm* — Rennie William Dover (57) ABSTRACT

In accordance with an embodiment, an offset-compensated active load includes a pair of transistors having control electrodes connected to their drain electrodes through coupling devices. The control electrodes of the transistors are connected to each other through a plurality of charge storage elements. In accordance with another embodiment, an offset current is generated in response to coupling input terminals of an input stage together. The offset current flows towards an active load which generates an offset voltage in response to the offset current. The offset voltage is stored in the plurality of charge storage devices of the offset-compensated active load.

20 Claims, 4 Drawing Sheets

OFFSET-COMPENSATED ACTIVE LOAD AND METHOD

BACKGROUND

The present invention relates, in general, to electronics and, more particularly, to offset compensation and methods to compensate for offset voltages.

Circuits such as operational amplifiers, comparators, and the like are used in a variety of applications including communications, signal processing, computers, remote sensing, automotive, aviation, etc. These circuits typically include an input stage coupled to a load stage. A drawback with these types of circuits is that mismatches of components of the input stage may cause non-ideal circuit performance. For example, mismatches in the transistors that make up the input stage may introduce an input offset voltage in the circuit. Richard Palmer in Application Report SLOA59, titled DC Parameters: Input Offset Voltage ($V_{IO}$), dated March 2001, and published by Texas Instruments describes causes of input offset voltage and techniques for reducing input offset voltage. In addition, U.S. Pat. No. 7,920,009 B2 issued to Stephen Robert Kosic et al. on Apr. 5, 2011, and U.S. Pat. No. 7,623,054 B2 issued to Masao Iriguchi et al. on Nov. 24, 2009, describe techniques for canceling an offset voltage. These techniques include switches that may introduce noise or inject charge into the input stages, but fail to compensate for this noise or injected charge.

Accordingly, it would be advantageous to have a circuit and a method for mitigating input offset voltage. It is desirable for the circuit and method to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage or logic low voltage level and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level, a logic high voltage, or a logic one voltage and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

The present description includes, among other features, a semiconductor component that includes an offset-compensated active load and a method for compensating for offsets. In accordance with one aspect, the offset-compensated active load includes a plurality of transistors, a plurality of switches, and a plurality of charge storage elements. Two of the plurality of transistors each have a control electrode and first and second current carrying electrodes, wherein the control electrode of one transistor is coupled to the control electrode of the other transistor through the plurality of charge storage elements. By way of example, the offset-compensated active load is capable of operating in at least two operating modes. In one operating mode, the control electrode of one transistor is coupled to its first current carrying electrode and the control electrode of the other transistor is coupled to its first current carrying electrode. In another operating mode, the control electrodes of the transistors are decoupled from their respective first current carrying electrodes.

In accordance with another aspect, offset in an active load may be compensated by generating an offset current in response to coupling input terminals of an input stage together, wherein the offset current flows towards an active load. An offset voltage is generated in response to the offset current, and the offset voltage may be stored in a plurality of charge storage elements coupled between transistors of the active load.

Figure 1:
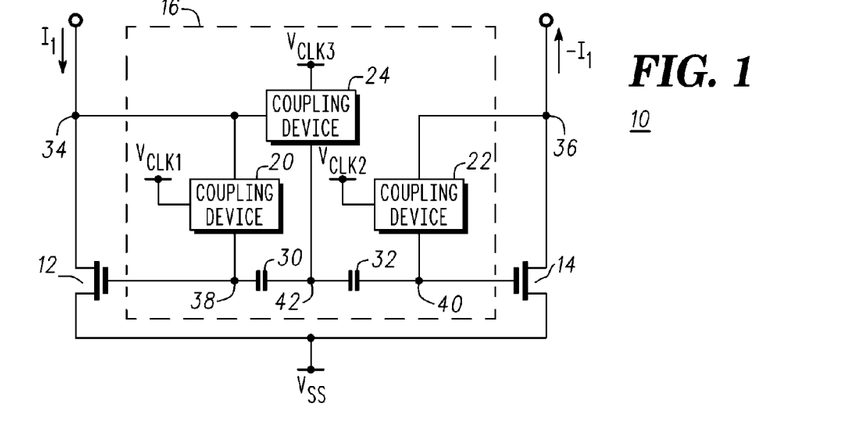
FIG. 1 is a schematic of an offset compensated active load in accordance with an embodiment of the present invention.

FIG. 1 is a circuit schematic of an offset-compensated active load 10 in accordance with an embodiment of the present invention. Active load 10 comprises mirror transistors 12 and 14 and an offset compensation stage 16, which includes coupling devices 20, 22, and 24, and charge storage elements 30 and 32. By way of example, transistors 12 and 14 are n-channel transistors and charge storage elements 30 and 32 are capacitors. Other suitable elements for charge storage devices 30 and 32 include Metal Oxide Semiconductor devices connected in a capacitor configuration or the like. Coupling devices 20 and 24 each have a terminal commonly connected to a drain terminal of transistor 12 to form a node 34. Transistor 14 has a drain terminal connected to a terminal of coupling device 22 to form a node 36. The other terminals of coupling devices 20 and 22 are connected to the gate terminals of mirror transistors 12 and 14 to form nodes 38 and 40, respectively. Capacitor 30 has a terminal connected to the gate terminal of mirror transistor 12 at node 38 and capacitor 32 has a terminal connected to the gate terminal of mirror transistor 14 at node 40. The other terminals of capacitors 30 and 32 are commonly connected together and to the other terminal of coupling device 24 to form a node 42. The source terminals of mirror transistors 12 and 14 are commonly connected together and for receiving a source of operating potential $V_{SS}$, which may be, for example, ground. The control terminals of coupling devices 20, 22, and 24 are coupled for receiving clock signals $V_{CLK1}$, $V_{CLK2}$, and $V_{CLK3}$, respectively. Clock signals may also be referred to as control signals. Suitable devices for coupling devices 20, 22, and 24 include MOS switches or transmission gates that may be coupled in a series configuration with voltage followers, controlled resistors, capacitors, or the like.

Figure 2:
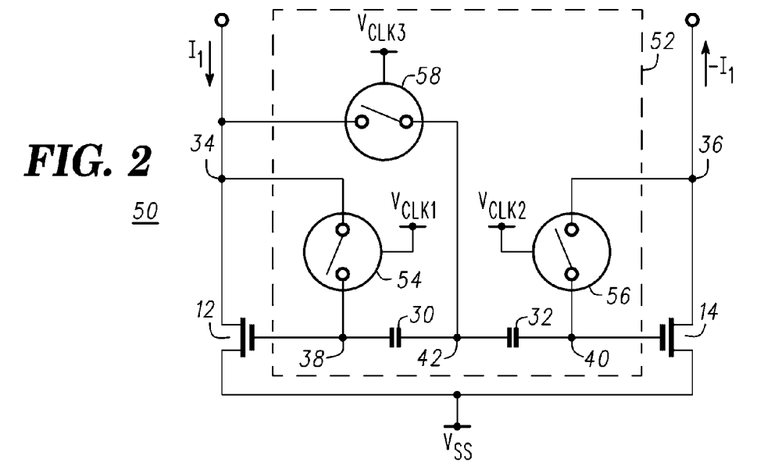
FIG. 2 is a schematic of an offset compensated active load in accordance with another embodiment of the present invention.

FIG. 2 is a circuit schematic of an offset-compensated active load 50 in accordance with another embodiment of the present invention. Active load 50 comprises transistors 12 and 14 and an offset compensation stage 52, which includes switches 54, 56, and 58, and charge storage elements 30 and 32. By way of example, transistors 12 and 14 are n-channel transistors and energy storage elements 30 and 32 are capacitors. Switches 54, 56, and 58 each have a control terminal and a pair of conduction terminals. One of the conduction terminals of switch 54 and one of the conduction terminals of switch 58 are commonly connected with the drain terminal of transistor 12 to form a node 34. One of the conduction terminals of switch 56 and the drain terminal of transistor 14 are commonly connected together to form a node 36. The other conduction terminal of switch 54 is connected to the gate terminal of mirror transistor 12 to form a node 38 and the other conduction terminal of switch 56 is connected to the gate terminal of mirror transistor 14 to form a node 40. Capacitor 30 has a terminal connected to the gate terminal of mirror transistor 12 at node 38 and capacitor 32 has a terminal connected to the gate terminal of mirror transistor 14 at node 40. The other terminals of capacitors 30 and 32 are commonly connected together and to the other conduction terminal of switch 58 to form a node 42. The source terminals of mirror transistors 12 and 14 are commonly connected together for receiving a source of operating potential $V_{SS}$. Switches 54, 56, and 58 have control terminals coupled for receiving clock signals $V_{CLK1}$, $V_{CLK2}$, and $V_{CLK3}$, respectively. It should be noted that a transistor may serve as a switch where the control electrode of the transistor is analogous to the control terminal of the switch and the current carrying electrodes of the transistor are analogous to the conduction terminals of the switch.

Figure 3:
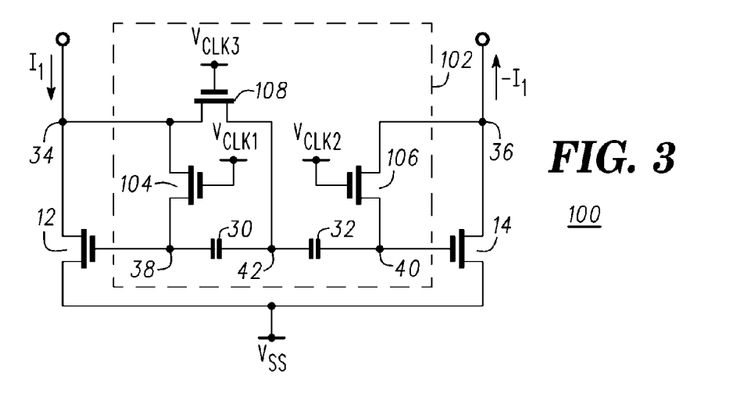
FIG. 3 is a schematic of an offset compensated active load in accordance with another embodiment of the present invention.

FIG. 3 is a circuit schematic of an offset-compensated active load 100 in accordance with an embodiment of the present invention. Active load 100 comprises mirror transistors 12 and 14 and an offset compensation stage 102, which includes transistors 104, 106, and 108, and charge storage elements 30 and 32. By way of example, transistors 12, 14, 104, 106, and 108 are n-channel transistors and energy storage elements 30 and 32 are capacitors. Transistors 12, 104, and 108 each have a drain terminal commonly connected together to form a node 34. Transistors 14 and 106 each have a drain terminal commonly connected together to form a node 36. The source terminals of transistors 104 and 106 are connected to the gate terminals of mirror transistors 12 and 14 to form nodes 38 and 40, respectively. Capacitor 30 has a terminal connected to the gate terminal of mirror transistor 12 at node 38 and capacitor 32 has a terminal connected to the gate terminal of mirror transistor 14 at node 40. The other terminals of capacitors 30 and 32 are commonly connected together and to the source terminal of transistor 108 to form a node 42. The source terminals of mirror transistors 12 and 14 are commonly connected together and for receiving a source of operating potential $V_{SS}$. The gate terminals of transistors 104, 106, and 108 are coupled for receiving clock signals $V_{CLK1}$, $V_{CLK2}$, and $V_{CLK3}$, respectively. It should be noted that in alternative embodiments the drain of transistor 108 may be connected to the drain of transistor 106 rather than to the drain of transistor 104.

Figure 4:
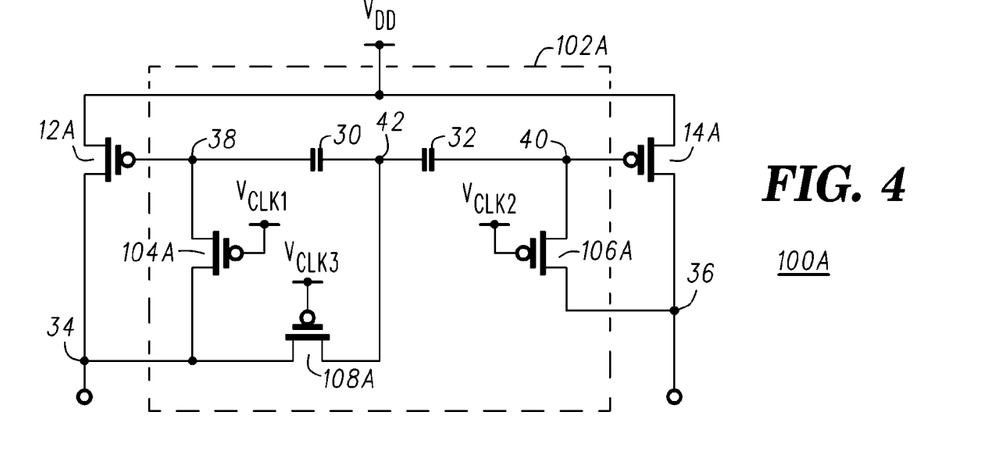
FIG. 4 is a schematic of an offset compensated active load in accordance with another embodiment of the present invention.

FIG. 4 is a circuit schematic of an offset-compensated active load 100A in accordance with another embodiment of the present invention. Active load 100A comprises mirror transistors 12A and 14A and an offset compensation stage 102A, which includes transistors 104A, 106A, and 108A, and charge storage elements 30 and 32. By way of example, transistors 12A, 14A, 104A, 106A, and 108A are p-channel transistors and energy storage elements 30 and 32 are capacitors. Transistors 12A, 104A, and 108A each have a drain terminal commonly connected together to form a node 34. Transistors 14A and 106A each have a drain terminal connected together to form a node 36. The source terminals of transistors 104A and 106A are connected to the gate terminals of mirror transistors 12A and 14A to form nodes 38 and 40, respectively. Capacitor 30 has a terminal connected to the gate terminal of mirror transistor 12A at node 38 and capacitor 32 has a terminal connected to the gate terminal of mirror transistor 14A at node 40. The other terminals of capacitors 30 and 32 are commonly connected together and to the source terminal of transistor 108A to form a node 42. The source terminals of mirror transistors 12A and 14A are commonly connected together and for receiving a source of operating potential $V_{DD}$. The gate terminals of transistors 104A, 106A, and 108A are coupled for receiving clock signals $V_{CLK1}$, $V_{CLK2}$, and $V_{CLK3}$, respectively. It should be noted that offset-compensated active load 100A is similar to offset-compensated active load 100 except that transistors 12A, 14A, 104A, 106A, and 108A are p-channel transistors. Thus, the letter "A" has been appended to reference characters 12, 14, 104, 106, and 108 to distinguish p-channel transistors from n-channel transistors.

Figure 5:
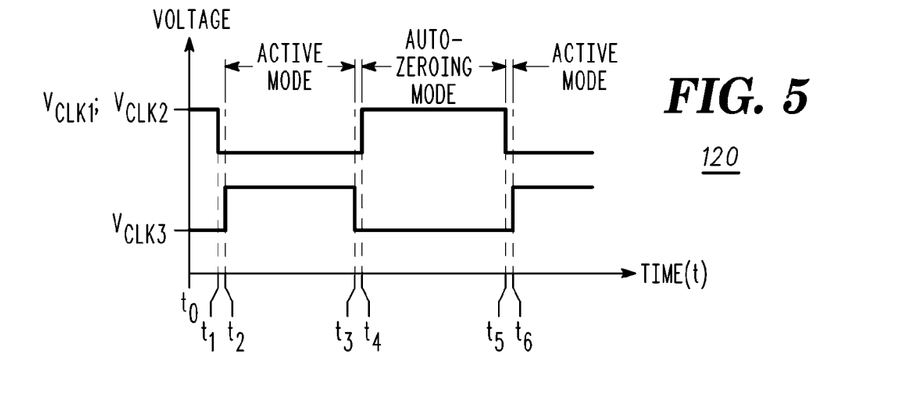
FIG. 5 is a timing diagram illustrating timing relationships of clock signals coupled to the circuits of FIGS. 1-4.

In operation, the offset-compensated active load operates in at least two operating modes: an active mode and an auto-zeroing or offset-cancellation mode. FIG. 5 is a timing diagram 120 of clock signals appearing at the control terminals of coupling devices such as coupling devices, 20, 22, and 24 of FIG. 1, switches 54, 56, and 58 of FIG. 2, or transistors 104, 106, and 108 of FIG. 3, respectively. It should be noted that timing diagram 120 may be changed to make it suitable for use with transistors 104A, 106A, and 108A of FIG. 4, by inverting clock signals $V_{CLK1}$, $V_{CLK2}$, and $V_{CLK3}$, respectively. For the sake of clarity, FIG. 5 will be described with reference to FIG. 3. Thus, clock signals $V_{CLK1}$, $V_{CLK2}$, and $V_{CLK3}$ are applied to the gate terminals of transistors 104, 106, and 108, respectively. In accordance with an embodiment, clock signals $V_{CLK1}$ and $V_{CLK2}$ are the same signals. At time $t_0$, in response to clock signals $V_{CLK1}$ and $V_{CLK2}$ being at a logic high voltage level and clock signal $V_{CLK3}$ being at a logic low voltage level, offset-compensated active load 10 operates in the auto-zeroing mode. Thus, transistor 104 is on, connecting node 34 to node 38, transistor 106 is on, connecting node 36 to node 40, and transistor 108 is off. It should be noted that a transistor that is on is analogous to a switch that is closed and a transistor that is off is analogous to a switch that is open. More particularly, applying a signal to the control electrode of a transistor that turns on the transistor is analogous to applying the signal to the control terminal of the switch that closes the switch and applying a signal to the control electrode of the transistor that turns off the transistor is analogous to applying the signal to the control terminal of the switch that opens the switch. In accordance with this embodiment, a differential current signal flows through nodes 34 and 36. By way of example, a current $I_1$ flows into node 34 and a current $-I_1$ flows from node 36. The differential current differentially charges capacitors 30 and 32.

At time $t_1$, clock signals $V_{CLK1}$ and $V_{CLK2}$ transition to a logic low voltage level turning off transistors 104 and 106 and at time $t_2$ clock signal $V_{CLK3}$ transitions to a logic high voltage level turning on transistor 108 and maintaining active load 100 in a current mirror configuration. In response to transistors 104 and 106 turning off and transistor 108 turning on, offset-compensated current mirror 100 operates in an active mode. Because transistors 104 and 106 are off, node 34 is disconnected or decoupled from node 38 and node 36 is disconnected or decoupled from node 40, respectively. In addition, because transistor 108 is on, node 34 is connected to node 42. It should be noted that the time period between times $t_1$ and $t_2$ is sufficiently short that biasing of active load 100 is maintained during the transition. Turning on transistor 108 creates glitches on node 42 that appear as a common mode signal at nodes 38 and 40. Because voltage variations at node 42 appear as a common mode signal when transistors 104 and 106 are off, they have no effect on the analog information stored differentially between nodes 38 and 40.

At time $t_3$, clock signal $V_{CLK3}$ transitions to a logic low voltage level turning off transistor 108 and at time $t_4$ clock signals $V_{CLK1}$ and $V_{CLK2}$ transition to a logic high voltage level turning on transistors 104 and 106 and offset-compensated active load 100 enters an auto-zeroing operating mode.

At time $t_5$, clock signals $V_{CLK1}$ and $V_{CLK2}$ transition to a logic low voltage level turning off transistors 104 and 106 and at time $t_6$ clock signal $V_{CLK3}$ transitions to a logic high voltage level turning on transistor 108. As described above, in response to transistors 104 and 106 turning off and transistor 108 turning on, offset-compensated current mirror 100 operates in an active mode. Offset-compensated active load 100 continues switching between the active operating mode and the auto-zeroing operating mode. It should be noted that a clocking scheme for a single period is shown and described with reference to FIG. 5. However, this is not a limitation of the present invention. Clocking signals $V_{CLK1}$, $V_{CLK2}$, and $V_{CLK3}$ can be periodic or aperiodic signals.

Figure 6:
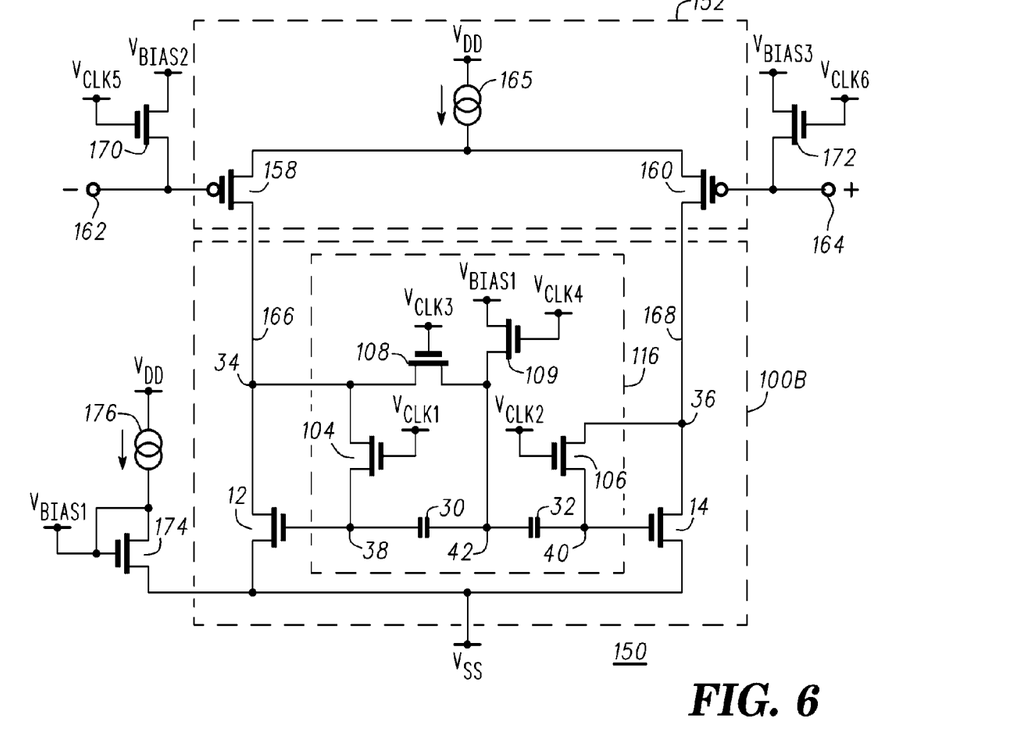
FIG. 6 is a schematic of a circuit with an offset compensated active load in accordance with an embodiment of the present invention.

FIG. 6 is a circuit schematic of a circuit 150 including an input stage 152 connected to an offset-compensated active load 100B having offset compensation stage 116. Input stage 152 comprises a pair of transistors 158 and 160 connected together in a differential configuration. By way of example, transistors 158 and 160 are p-channel field effect transistors, where each transistor has a control electrode and a pair of current carrying electrodes. The control electrodes of transistors 158 and 160 serve as input terminals 162 and 164, respectively, of input stage 152. The source terminals of transistors 158 and 160 are commonly connected together and to a terminal of a current source 165. The other terminal of current source 165 is coupled for receiving a source of operating potential such as, for example, $V_{DD}$. The drain terminals of transistors 158 and 160 serve as output terminals 166 and 168 of input stage 152, respectively.

A transistor 170 has a gate terminal coupled for receiving a clock signal $V_{CLK5}$, a drain terminal coupled for receiving a reference potential $V_{BIAS2}$, and a source terminal coupled to the gate terminal of transistor 158. A transistor 172 has a gate terminal coupled for receiving a clock signal $V_{CLK6}$, a drain terminal coupled for receiving a reference potential $V_{BIAS3}$, and a source terminal coupled to the gate terminal of transistor 160.

A transistor 174 has a gate terminal commonly connected to its drain terminal to generate a biasing potential $V_{BIAS1}$, and a source terminal connected to the source terminals of mirror transistors 12 and 14. The commonly connected gate and drain terminals are connected to a terminal of a current source 176. Current source 176 has another terminal coupled for receiving source of operating potential $V_{DD}$.

Offset-compensated active load 100B includes active load 100 described with reference to FIG. 3 and a transistor 109, which sets the potential at node 42 to a predetermined level during the auto-zeroing mode of operation. Transistor 28 has a gate terminal coupled for receiving a clock signal $V_{CLK4}$, a drain terminal coupled for receiving a biasing potential $V_{BIAS1}$, and a source terminal connected to node 42. It should be noted that transistor 109 is an optional element and that the offset-compensated active load has been designated by reference character 100B in FIG. 6 because it differs from the offset-compensated active load 100 by the addition of transistor 109, which sets a voltage at node 42. It should be further noted that in embodiments in which transistor 109 is absent, the potential at node 42 may achieve a defined potential after several cycles of operation.

Figure 7:
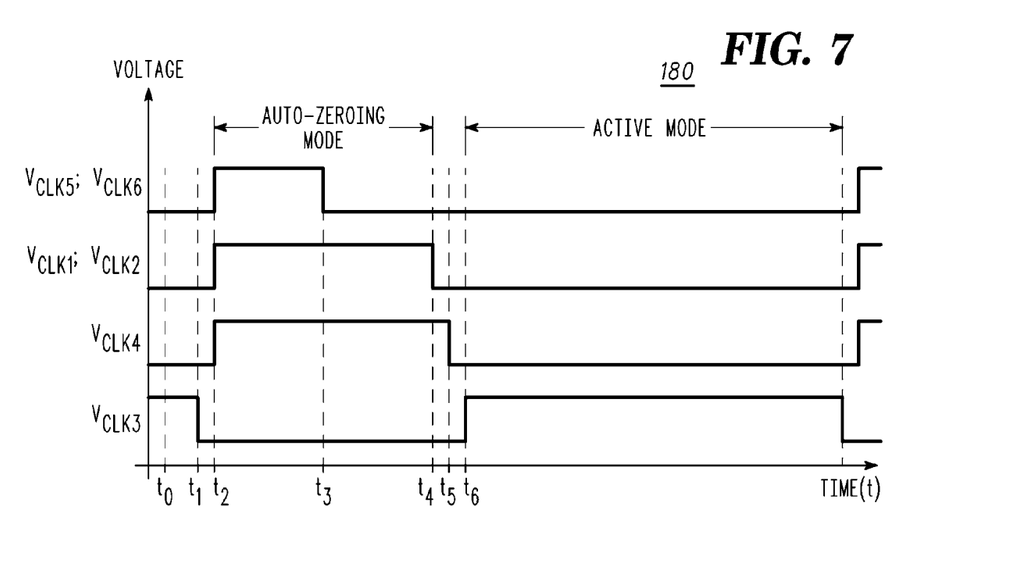
FIG. 7 is a timing diagram illustrating timing relationships of clock signals coupled to the circuit of FIG. 6.

In operation, circuit 150 operates in at least two operating modes: an active mode and an auto-zeroing or offset-cancellation mode. In response to operation in the auto-zeroing mode, compensated active load 100B compensates for charge injected into the input stage. Clock signals $V_{CLK1}$, $V_{CLK2}$, $V_{CLK3}$, and $V_{CLK4}$ are applied to the gates of transistors 104, 106, 108, and 109, respectively, to store an offset compensation charge in capacitors 30 and 32. FIG. 7 is a timing diagram 180 of the clock signals appearing at the gate terminals of transistors 104, 106, 108, and 109. In accordance with an embodiment, clock signals $V_{CLK1}$ and $V_{CLK2}$ are the same signals and clock signals $V_{CLK5}$ and $V_{CLK6}$ are the same signals. At time $t_0$, clock signals $V_{CLK1}$, $V_{CLK2}$, $V_{CLK4}$, $V_{CLK5}$, and $V_{CLK6}$ are at a logic low voltage level and clock signal $V_{CLK3}$ is at a logic high voltage level. Thus, transistor 108 is on and connects node 34 to node 42 forming a current mirror from transistors 12 and 14. Because clock signals $V_{CLK5}$ and $V_{CLK6}$ are at a logic low voltage level, transistors 170 and 172 are off.

At time $t_1$, clock signal $V_{CLK3}$ transitions to a logic low voltage level, turning off transistor 108 and at time $t_2$, clock signals $V_{CLK1}$, $V_{CLK2}$, $V_{CLK4}$, $V_{CLK5}$, and $V_{CLK6}$ transition to a logic high voltage level which begins an auto-zeroing or calibration mode. As discussed above, in response to clock signals $V_{CLK1}$, $V_{CLK2}$, $V_{CLK4}$, $V_{CLK5}$, and $V_{CLK6}$ transitioning to a logic high voltage level, transistors 104, 106, 109, 170, and 172, respectively, turn on, which is analogous to closing switches in embodiments where these transistors operate as switches. In response to clock signal $V_{CLK4}$ being at a logic high voltage level, transistor 109 is on and a voltage substantially equal to voltage $V_{BIAS1}$ appears at node 42. Because transistors 104 and 106 are on, node 34 is connected or coupled to node 38 and node 36 is connected or coupled to node 40, respectively. In addition, because transistor 108 is off, node 34 is disconnected from node 42 and because transistor 109 is on, bias voltage $V_{BIAS1}$ is connected to node 42. It should be noted that the time period from time $t_1$ to time $t_2$ is sufficiently short that mirror transistors 12 and 14 continue to operate as a current mirror. In accordance with an embodiment, bias potentials $V_{BIAS2}$ and $V_{BIAS3}$ are set to the same potential, which shorts the input terminals of input stage 152 together. In this configuration, any difference between the drain currents of transistors 158 and 160 flows differentially from output terminals 166 and 168 into mirror transistors 12 and 14, respectively. This current, which may be referred to as a differential offset current, is converted into a differential voltage by transistors 12 and 14, wherein the differential voltage is stored in capacitors 30 and 32. This voltage may be referred to as an offset compensation voltage. It should be noted that in response to a first portion of the differential offset current transistor 12 generates a voltage and transistor 14 generates another voltage that cooperate to form the differential input offset compensation voltage. Transistor 12 generates a first portion of the offset compensation voltage which may be stored in capacitor 30 and transistor 14 generates another portion of the offset compensation voltage, which may be stored in capacitor 32. The voltages stored in capacitors 30 and 32 are an image of the input offset voltage.

At time $t_3$, clock signals $V_{CLK5}$ and $V_{CLK6}$ transition to a logic low voltage level, turning off transistors 170 and 172, and disconnecting input terminals 162 and 164 from bias signals $V_{BIAS2}$ and $V_{BIAS3}$. In response to being turned off, transistors 170 and 172 inject charges into input terminals 162 and 164 of input stage 152, respectively. It should be noted that additional circuitry may be connected to input terminals 162 and 164 through which charge may be injected. For the sake of clarity, this circuitry has been omitted. The injected charges cancel each other because of the circuit's differential configuration. It should be noted that any residual charge imbalance at input terminals 162 and 164 is further cancelled in response to clock signals $V_{CLK1}$, $V_{CLK2}$, and $V_{CLK4}$ being at a logic high voltage level because transistors 12 and 14 are still connected as diodes in this state.

At time $t_4$, clock signals $V_{CLK1}$ and $V_{CLK2}$ transition to a logic low voltage level, turning off transistors 104 and 106, and ending the auto-zeroing operating mode. At time $t_5$, clock signal $V_{CLK4}$ transitions to a logic low voltage level turning off transistor 109, and circuit 150 enters an active operating mode in response to clock signal $V_{CLK3}$ transitioning to a logic high voltage level and turning on transistor 108 at time $t_6$, which reconfigures mirror transistor 12 as an input transistor of a current mirror. Because transistors 104 and 106 are off, node 34 is disconnected or decoupled from node 38 and node 36 is disconnected or decoupled from node 40, respectively. In addition, because transistor 108 is on, node 34 is connected to node 42 and because transistor 109 is off, bias voltage $V_{BIAS1}$ is disconnected from node 42. Although a clocking scheme for a single period is shown and described with reference to FIG. 5, this is not a limitation of the present invention. Clocking signals $V_{CLK1}$, $V_{CLK2}$, and $V_{CLK3}$ can be periodic or aperiodic signals.

It should be noted that charge injection into node 42 does not contribute to the offset voltage because node 42 acts as a common-mode bias to transistors 12 and 14. Transistor 174 provides a DC bias to node 42 during the auto-zeroing operating mode.

Figure 8:
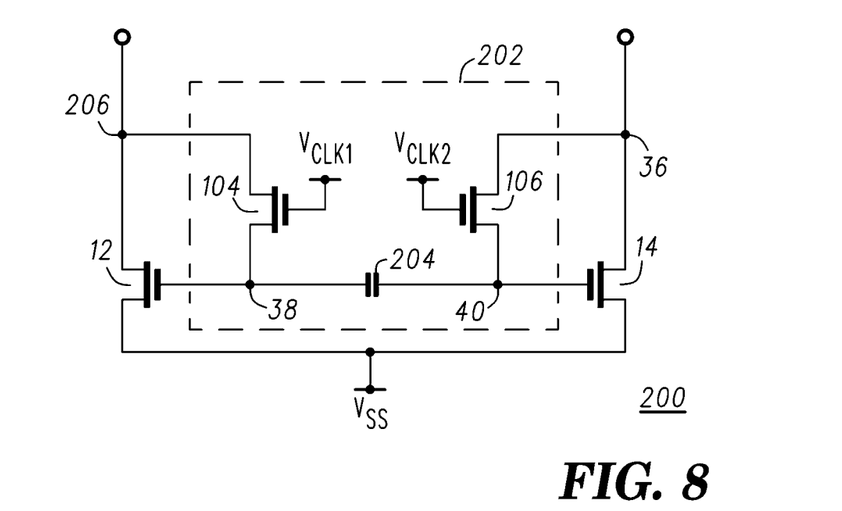
FIG. 8 is a schematic of an offset compensated active load in accordance with an embodiment of the present invention.

FIG. 8 is a circuit schematic of an offset-compensated active load 200 in accordance with another embodiment of the present invention. Active load 200 comprises mirror transistors 12 and 14 and an offset compensation stage 202, which includes transistors 104 and 106, and a charge storage element 204. By way of example, transistors 12, 14, 104, and 106 are n-channel transistors and energy storage element 204 is a capacitor. Transistors 12 and 104 each have a drain terminal commonly connected together to form a node 206. Transistors 14 and 106 each have a drain terminal commonly connected together to form node 36. The source terminals of transistors 104 and 106 are connected to the gate terminals of mirror transistors 12 and 14 to form nodes 38 and 40, respectively. Capacitor 204 has a terminal connected to the gate terminal of mirror transistor 12 at node 38 and a terminal connected to the gate terminal of mirror transistor 14 at node 40. The source terminals of mirror transistors 12 and 14 are commonly connected together and for receiving a source of operating potential $V_{SS}$. The gate terminals of transistors 104 and 106 are coupled for receiving clock signals $V_{CLK1}$ and $V_{CLK2}$, respectively.

Figure 9:
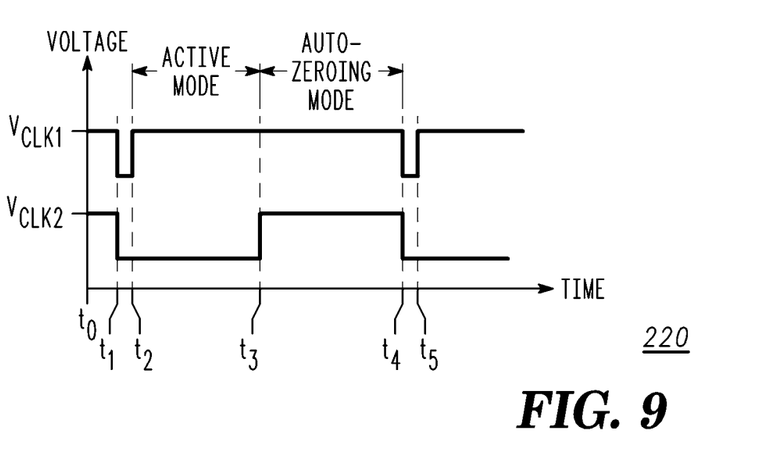
FIG. 9 is a timing diagram illustrating timing relationships of clock signals coupled to the circuit of FIG. 8.

Like active load 10, offset-compensated active load 200 operates in at least two operating modes: an active mode and an auto-zeroing or offset-cancellation mode. Clock signals $V_{CLK1}$ and $V_{CLK2}$ are applied to the gates of transistors 104 and 106, respectively. FIG. 9 is a timing diagram 220 of the clock signals appearing at the gate terminals of transistors 104 and 106. At time $t_0$, in response to clock signals $V_{CLK1}$ and $V_{CLK2}$ being at a logic high voltage level, offset-compensation active load 200 operates in the auto-zeroing mode. Thus, transistor 104 is on, connecting node 206 to node 38 and transistor 106 is also on, connecting node 36 to node 40 so that transistors 12 and 14 are configured as diodes. The offsets associated with currents injected into nodes 206 and 36 are stored differentially across capacitor 204.

At time $t_1$, clock signals $V_{CLK1}$ and $V_{CLK2}$ transition to a logic low voltage level turning off transistors 104 and 106 and at time $t_2$ clock signal $V_{CLK1}$ transitions to a logic high voltage level turning on transistor 104. In response to transistor 104 turning on, offset-compensated current mirror 200 operates in an active mode. Because of the gate-to-source capacitance intrinsic to a field effect transistor, glitches occur at node 38 in response to entering the active operating mode. These glitches are attenuated at node 40 by a capacitive divider formed by capacitor 204 and the gate-to-source capacitance ($C_{gs14}$) of transistor 14.

At time $t_3$, clock signal $V_{CLK2}$ transitions to a logic high voltage level turning on transistor 106 and offset-compensated active load 200 enters an auto-zeroing operating mode.

At time $t_4$, clock signals $V_{CLK1}$ and $V_{CLK2}$ transition to a logic low voltage level turning off transistors 104 and 106 and at time $t_5$ clock signal $V_{CLK1}$ transitions to a logic high voltage level. In response to clock signal $V_{CLK1}$ transitioning to the logic high voltage level at time $t_5$, offset-compensated active load 200 enters an active operating mode. Although a clocking scheme for a single period is shown and described with reference to FIG. 9, this is not a limitation of the present invention. Clocking signals $V_{CLK1}$ and $V_{CLK2}$ can be periodic or aperiodic signals.

By now it should be appreciated that a circuit with an offset-compensated active load and a method for compensating for offset have been provided. Compensating for offset may be referred to as auto-zeroing wherein a compensation signal compensates for an offset signal. In accordance with embodiments, the active load includes coupling devices that short nodes within the active load together. For example, in embodiments in which the active load includes a current mirror having at least two transistors, the gate and drain terminals of one transistor are coupled together via a coupling device such as a switch or a transistor, and the gate and drain terminals of another transistor are coupled together via another coupling device, and the gate terminals of the transistors are coupled to each other through a plurality of capacitors. The offset-compensation can provide differential compensation in circuit configurations in which the normal operating mode of the circuit is single-ended. Although the active load has been shown as a current mirror, this is not a limitation of the present invention. Other suitable active loads include current sources, current sources degenerated with resistors, cascode mirrors or sources, or the like. It should be noted that for cascoded sources and mirrors, the coupling devices connect the gates of mirror transistors to the drains of their cascode elements and the drains of cascoding devices are analogous to the drains of the transistors connected in series with them.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. An offset-compensated active load, comprising:
    a first transistor having a control electrode and first and second current carrying electrodes;
    a second transistor having a control electrode and first and second current carrying electrodes, the first current carrying electrode of the first transistor coupled to the first current carrying electrode of the second transistor;
    a first coupling device having a control terminal and first and second terminals, the control terminal coupled for receiving a first control signal, the first terminal coupled to the control electrode of the first transistor and the second terminal coupled to the second current carrying electrode of the first transistor;
    a second coupling device having a control terminal and first and second terminals, the control terminal coupled for receiving a second control signal, the first terminal coupled to the control electrode of the second transistor and the second terminal coupled to the second current carrying electrode of the second transistor;
    a first charge storage element having first and second terminals, the first terminal coupled to the control terminal of the first transistor and the second terminal switchably coupled to the second current carrying electrode of the first transistor;
    a second charge storage element having first and second terminals, the first terminal coupled to the control terminal of the second transistor and the second terminal switchably coupled to the second current carrying electrode of the first transistor.

2. The offset-compensated active load of claim 1, wherein the first and second coupling devices are first and second transistors, respectively.

3. The offset-compensated active load of claim 1, wherein the first and second control signals are substantially the same signal.

4. The offset-compensated active load of claim 1, wherein the second terminals of the first and second charge storage elements are coupled together.

5. The offset-compensated active load of claim 4, further including a third coupling device having a control terminal coupled for receiving a third control signal, a first terminal coupled to the second current carrying electrode of the first transistor, and a second terminal directly coupled to the second terminal of a first charge storage element of the plurality of charge storage elements.

6. The offset-compensated active load of claim 5, further including a fourth coupling device having a control terminal coupled for receiving a fourth control signal, a first terminal coupled for receiving a first source of operating potential, and a second terminal directly coupled to the second terminal of the first coupling device and to the second terminal of the first charge storage element.

7. The offset-compensated active load of claim 6, wherein the first, second, third, and fourth coupling devices comprise transistors.

8. An offset-compensated active load, comprising:
    a first transistor having a control electrode and first and second current carrying electrodes;
    a second transistor having a control electrode and first and second current carrying electrodes, the first current carrying electrode of the first transistor coupled to the first current carrying electrode of the second transistor;
    a first coupling device having a control terminal and first and second terminals, the control terminal coupled for receiving a first control signal, the first terminal coupled to the control electrode of the first transistor and the second terminal coupled to the second current carrying electrode of the first transistor;
    a second coupling device having a control terminal and first and second terminals, the control terminal coupled for receiving a second control signal, the first terminal coupled to the control electrode of the second transistor and the second terminal coupled to the second current carrying electrode of the second transistor;
    a first charge storage element having first and second terminals, the first terminal coupled to the control electrode of the first transistor;
    a second charge storage element having first and second terminals, the first terminal coupled to the control electrode of the second transistor;
    a third coupling device having a control terminal coupled for receiving a third control signal, a first terminal coupled to the second current carrying electrode of the first transistor, and a second terminal coupled to the second terminal of the first charge storage element;
    a fourth coupling device having a control terminal coupled for receiving a fourth control signal, a first terminal coupled for receiving a first source of operating potential, and a second terminal commonly coupled to the second terminal of the first coupling device and to the second terminal of the first charge storage element; and
    further including an input stage having an input terminal and first and second output terminals, the first output terminal coupled to the second current carrying electrode of the first transistor and the second output terminal coupled to the second current carrying electrode of the second transistor.

9. The offset-compensated active load of claim 8, wherein the input stage comprises a pair of differentially coupled transistors.

10. The circuit with offset compensation of claim 4, wherein the first and second charge storage elements are capacitors.

11. A method of operating an active load to compensate for offset in a circuit, comprising:
providing the active load, wherein the active load comprises a first transistor having a gate, a drain, and a source, a second transistor having a gate, a drain, and a source, a first switch having a control terminal and first and second terminals, a second switch having a control terminal and first and second terminals, a third switch having a control terminal and first and second terminals, a first capacitor having first and second terminals, and a second capacitor having first and second terminals, the sources of the first and second transistors coupled together, the gate of the first transistor coupled to the first terminals of the first switch and the first capacitor, the gate of the second transistor coupled to the first terminals of the second switch and the second capacitor, the second terminal of the first switch coupled to the drain of the first transistor and the first terminal of the third switch, the second terminal of the second switch coupled to the drain of the second transistor, and the second terminals of the first and second capacitors coupled together and to the second terminal of the third switch;
generating an offset current in response to coupling input terminals of an input stage together, closing the first and second switches and opening the third switch, wherein the first and second capacitors are electrically decoupled from the drain of the first transistor and the offset current flows towards the active load;
generating an offset compensation voltage in response to the offset current; and
storing the offset compensation voltage in the first and second capacitors.

12. The method of claim 11, wherein generating the offset current includes closing third and fourth end switches.

13. The method of claim 11, wherein generating the offset compensation voltage in response to the offset current further includes using the first and second transistors to generate the offset compensation voltage.

14. The method of claim 11, wherein generating the offset current includes generating a differential offset current and further including using the first and second transistors to generate first and second portions of the offset compensation voltage, respectively, and storing the first portion of the offset compensation voltage in the first capacitor and the second portion of the offset compensation voltage in the second capacitor.

15. A method of compensating for offset in a circuit, comprising:
providing an active load having first and second transistors, first and second switches, and a plurality of charge storage elements, the first and second transistors each having a control electrode and first and second current carrying electrodes and each charge storage element of the plurality of charge storage elements having first and second terminals, the control electrode of the first transistor coupled to the control electrode of the second transistor through the plurality of charge storage elements, wherein the second terminals of first and second charge storage elements of the plurality of charge storage elements are coupled together at a first node;
operating the active load in a first operating mode, wherein in the first operating mode, the control electrode of the first transistor is coupled to the first current carrying electrode of the first transistor at a second node and the control electrode of the second transistor is coupled to the first current carrying electrode of the second transistor at a third node; and
operating the active load in a second operating mode, wherein in the second operating mode, the first node is decoupled from the first current carrying electrode of the first transistor and the control electrode of the second transistor is decoupled from the first current carrying electrode of the second transistor.

16. The method of claim 15, wherein providing the active load having first and second transistors and the plurality of charge storage elements further includes providing a first charge storage element with first and second terminals and a second charge storage element with first and second terminals, the control electrode of the first transistor coupled to the control electrode of the second transistor through the first and second charge storage elements, wherein the control electrode of the first transistor is coupled to the first terminal of the first charge storage element, the control electrode of the second transistor is coupled to the first terminal of the second charge storage element; and wherein in the second operating mode the first node is coupled to the first current carrying electrode of the first transistor.

17. The method of claim 16, wherein operating the active load in the first operating mode includes closing a first switch coupled between the second node and the control electrode of the first transistor, closing a second switch coupled between the third node and the control electrode of the second transistor, and closing a third switch coupled between the first node and a first source of operating potential.

18. The method of claim 16, wherein operating the active load in the second operating mode includes opening a first switch coupled between the second node and the control electrode of the first transistor, opening a second switch coupled between the third node and the control electrode of the second transistor, opening a third switch coupled between the first node and a first source of operating potential, and closing a fourth switch coupled between the first node and the second node.

19. The method of claim 16, further including injecting a differential current into the active load.

20. The method of claim 19, further including using the differential current to generate an offset compensation signal and storing the offset compensation signal in the first and second charge storage elements.

* * * * *